(12) United States Patent
Eagle

(10) Patent No.: US 8,867,205 B2
(45) Date of Patent: Oct. 21, 2014

(54) FLUID COOLING SYSTEM AND ASSOCIATED FITTING ASSEMBLY FOR ELECTRONIC COMPONENT

(71) Applicant: International Business Machines Corporation, Armonk, NY (US)

(72) Inventor: Jason R. Eagle, Kasson, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/796,141

(22) Filed: Mar. 12, 2013

(65) Prior Publication Data

US 2013/0188316 A1 Jul. 25, 2013

Related U.S. Application Data

(63) Continuation of application No. 12/917,977, filed on Nov. 2, 2010, now Pat. No. 8,456,833.

(51) Int. Cl.
*H05K 7/20* (2006.01)
*G06F 1/20* (2006.01)
*F28F 9/02* (2006.01)

(52) U.S. Cl.
CPC .......... *H05K 7/20254* (2013.01); *F28F 9/0256* (2013.01); *F28F 9/0251* (2013.01); *H05K 7/20781* (2013.01); *G06F 1/20* (2013.01); *H05K 7/20272* (2013.01); *F28F 9/0246* (2013.01)
USPC ...... 361/689; 361/679.53; 361/699; 361/702; 361/726; 361/733; 62/259.2; 165/104.33

(58) Field of Classification Search
USPC ....................... 361/676–678, 679.46–679.58, 361/688–733, 752, 760, 831
See application file for complete search history.

(56) References Cited

U.S. PATENT DOCUMENTS

| | | | |
|---|---|---|---|
| 7,286,355 B2 * | 10/2007 | Cheon | 361/699 |
| 7,639,498 B2 | 12/2009 | Campbell et al. | |
| 8,027,162 B2 | 9/2011 | Campbell et al. | |
| 2008/0310104 A1 * | 12/2008 | Campbell et al. | 361/690 |
| 2009/0080151 A1 * | 3/2009 | Kalms et al. | 361/679.52 |
| 2009/0120607 A1 * | 5/2009 | Cheon et al. | 165/46 |
| 2009/0126909 A1 * | 5/2009 | Ellsworth et al. | 165/104.33 |

(Continued)

OTHER PUBLICATIONS

Brochard, Luigi, "High Performance Computing with POWER7," IBM Power Systems, 2010 IBM Corporation.

(Continued)

*Primary Examiner* — Courtney Smith
(74) *Attorney, Agent, or Firm* — Wood, Herron & Evans, LLP

(57) ABSTRACT

A fluid cooling system and associated fitting assembly for an electronic component such as a multi-processor computer offer easy and reliable connect and disconnect operations while doing so in a minimum amount of available space without damaging associated components of an electronic device, computer or cooling system. One exemplary fitting assembly includes a manifold mount with a port that is in fluid communication with a manifold tube. A fitting is sized and configured to mate with the port and is in fluid communication with associated cooling tubes of a cold plate. A latch is pivotally mounted to the manifold mount for movement to and between a first position in which the latch secures the fitting to the manifold mount and a second position in which the fitting is capable of being disconnected from the manifold mount.

24 Claims, 6 Drawing Sheets

(56) References Cited

U.S. PATENT DOCUMENTS

| | | | |
|---|---|---|---|
| 2009/0277616 A1* | 11/2009 | Cipolla et al. | 165/104.33 |
| 2010/0002393 A1* | 1/2010 | Campbell et al. | 361/699 |
| 2010/0085712 A1* | 4/2010 | Hrehor et al. | 361/699 |
| 2010/0252234 A1* | 10/2010 | Cambell et al. | 165/80.2 |
| 2012/0085524 A1* | 4/2012 | Balcerak et al. | 165/177 |

OTHER PUBLICATIONS

Campbell, Levi and Ellsworth, Jr., Michael J., "Back to the Future with a Liquid Cooled Supercomputer", Aug. 1, 2009.

Schmidt, Roger, "Packaging of New Servers—energy efficiency aspects," 1st Berkeley Symposium on Energy Efficient Electronics, Jun. 11-12, 2009.

* cited by examiner

FLUID COOLING SYSTEM AND ASSOCIATED FITTING ASSEMBLY FOR ELECTRONIC COMPONENT

CROSS-REFERENCE TO RELATED APPLICATIONS

This application is a continuation of U.S. patent application Ser. No. 12/917,977, filed on Nov. 2, 2010 by Jason R. Eagle (now issued as U.S. Pat. No. 8,456,833), the entire disclosure of which is incorporated by reference herein.

FIELD OF THE INVENTION

This invention relates generally to cooling of electronic components and more particularly to a fitting for coupling tubes containing cooling fluid to a fluid manifold system.

BACKGROUND OF THE INVENTION

Since the development of electronic digital computers, efficient removal of heat has played a key role in insuring the reliable operation of successive generations of computers. In many instances the trend toward higher circuit packaging density to provide reductions in circuit delay time (i.e., increased speed) has been accompanied by increased power dissipation requirements.

One approach to cooling such electronic components was to utilize hybrid air-to-water cooling in otherwise air-cooled machines to control cooling air temperatures. With the precipitous rise in both chip and module powers that occurred throughout the 1980s, it was determined that the most effective way to manage chip temperatures in multichip modules was through the use of indirect water-cooling.

The increased use of complementary metal oxide semiconductor (CMOS) based circuit technology in the early 1990s led to a significant reduction in power dissipation and a return to totally air-cooled machines. However, this was but a brief respite as power and packaging density rapidly increased, first matching and then exceeding the performance of the earlier machines. These increases in packaging density and power levels have resulted in unprecedented cooling demands at the package, system and data center levels, leading to a return of water cooling.

Many large scale computing systems contain multiple dual core processor modules, often as many as 16 or more. An assembly of an equal number of cold plates is often used to cool the processors. The assembly in one prior system consists of the cold plates (one cold plate for each processor module), tubing that connects groups of cold plates in series, tubing that connects each grouping of cold plates, or quadrant, to a common set of supply and return lines, and two hoses that connect to system level manifolds in the rack housing the processor modules or nodes.

The ability to remove a node from the liquid cooling system without adversely affecting the operation of the remaining system is provided by fluid couplers that can be uncoupled quickly and easily with virtually no liquid leakage (i.e. "quick connects").

However, due to the ever increasing demand for computing capacity and often limited available space, more processor nodes are placed in closer proximity to one another with less and less available free space for the cooling systems. As such, known quick connect fittings used in prior cooling systems often do not fit in the allocated space. Other than known quick connect fittings, other options use a nut to seal either an 0-ring, or a compression ring that pinches the tubing to make a seal. These connectors are often not feasible due to the extreme size of the components and the fact that there is no available tool or wrench clearance to connect and disconnect these types of fitting. Additionally, tightening these types of fittings produces a high torque on the delicate brazed tube assembly connected to the cold plates. The twisting torque could damage tubing, or put stress on electronic modules that the cold plates interface with.

Therefore, an improved fitting assembly that overcomes these problems in the prior art while still offering durable and reliable connect and disconnect operations in a minimum of available space is needed.

SUMMARY OF THE INVENTION

According to various embodiments, this invention includes a fluid cooling system for an electronic component, the electronic component with a fluid cooling system and a fitting assembly for use in a fluid cooling system for an electronic component that overcomes the above described problems and others in the prior art.

In one embodiment, this invention includes a cooling system for an electronic component, such as a multi-processor computer including a number of cold plates each cooling one of the processors using a cooling medium. Cooling tubes are each routed through one of the cold plates to carry the liquid cooling medium there through. A manifold assembly has a manifold tube in communication with each of the cooling tubes to transmit the liquid cooling medium to and from each of the cold plates. A number of fitting assemblies connect the various cooling tubes to the manifold assembly. In one embodiment, each fitting assembly includes a manifold with the manifold tube passing there through. A port in the manifold is in fluid communication with the manifold tube. A fitting is sized and configured to mate with the port and is in fluid communication with the associated cooling tubes of one of the cold plates. A latch is pivotally mounted to the manifold mount for movement to and between a first position in which the latch secures the fitting to the manifold mount and a second position in which the fitting is capable of being connected and disconnected from the manifold.

In one embodiment, the latch is generally U-shaped with a pair of legs each extending from a central portion of the latch and the legs are pivotally coupled to opposite sides of the manifold. The central portion of the latch captures the fitting onto the manifold when the latch is in the first position. The fitting assembly may include a load screw threadably inserted through the central portion of the latch to engage the fitting when the latch is in the first position to thereby secure the fitting to the manifold. In one embodiment, a longitudinal axis of the load screw is aligned with a longitudinal axis of the port when the latch is in the first position to align the holding force of the fitting with the manifold. A bearing plate may be mounted on the fitting and positioned to be engaged by the load screw when the latch is in the first position to thereby alleviate stress and avoid damage to the fitting. A pair of spaced channels may be formed on opposite sides of the fitting to assist in installation and removal of the fitting relative to the manifold. The same fitting assembly design according to one embodiment of this invention may be utilized for either the supply side of the cooling fluid medium for the cold plate or the return side of the cooling fluid medium for the cold plate.

The invention in various embodiments includes a fluid cooling system for electronic components such as computers, electronic components or computers with a fluid cooling system and a fitting assembly for use in such environments. The fitting assembly provides the advantages of offering easy and reliable connect and disconnect operations while doing so in a minimum amount of available space without the need for extensive tool operation space or damaging the associated components of the electronic device, computer or cooling system.

DETAILED DESCRIPTION

Figure 5:
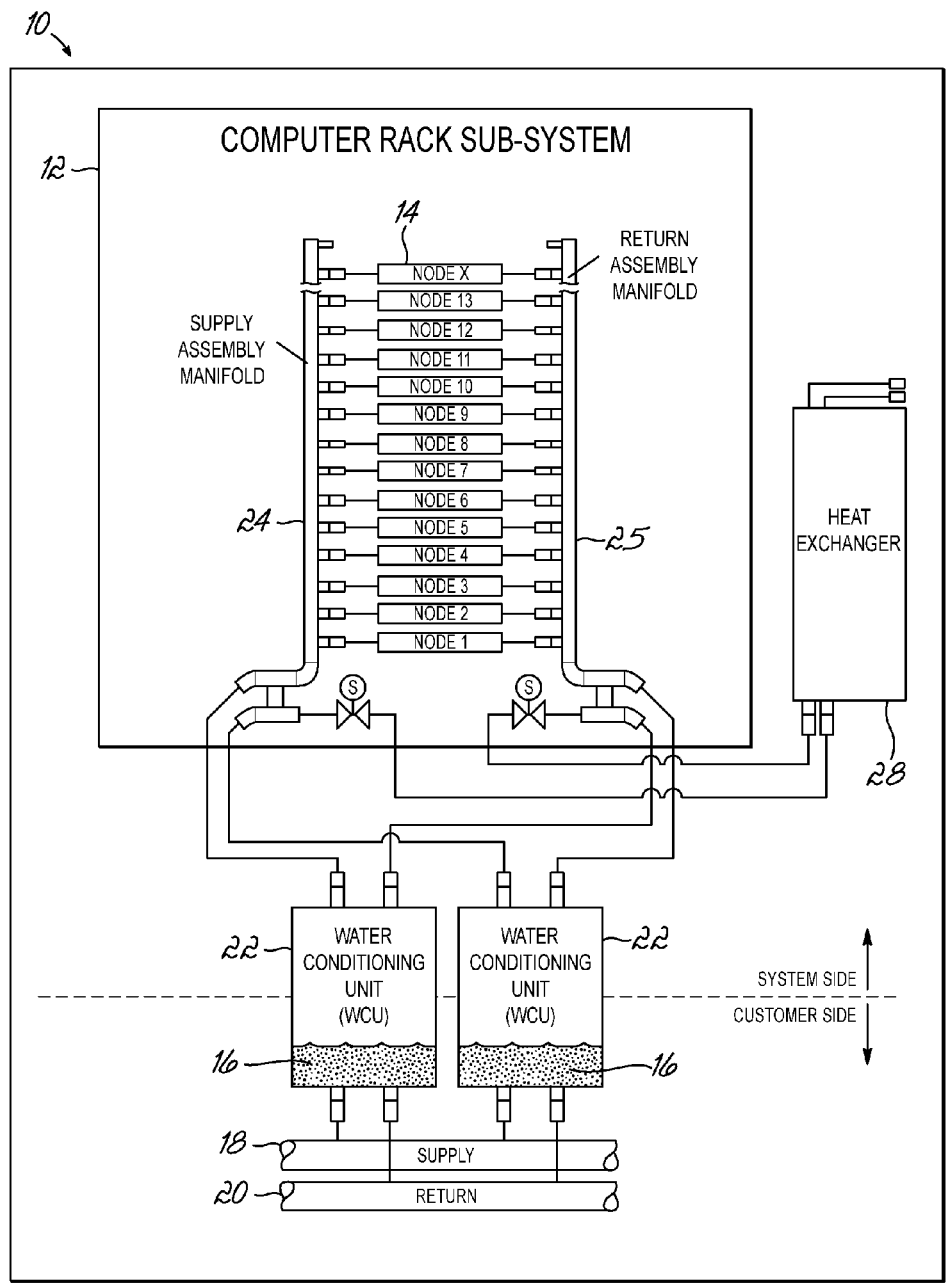
FIG. 5 is a schematic drawing of an exemplary electronic component and associated fluid cooling system in which the fitting of this invention may be used.

Various embodiments and aspects of this invention are shown in the attached drawings in which FIG. 5 schematically shows a cooling system 10 for an electronic component 12 such as a computer rack subsystem or the like. The electronic component or computer rack subsystem 12 may include a number of nodes 14, each of which includes a dual core-processor. During operation of the processors, heat is generated which is dissipated by the cooling system 10 according to various embodiments of this invention. The cooling system 10 according to one embodiment of this invention utilizes a liquid cooling medium 16 such as water, although other liquid cooling mediums may be utilized within the scope of this invention. The cooling medium 16 is supplied to the cooling system 10 via a supply line 18 and extracted from the cooling system 10 via a return line 20. According to the exemplary cooling system shown in FIG. 5, the cooling medium supply line 18 is fed to one of two water conditioning units 22, although another number of water conditioning units 22 may be utilized. The cooling medium 16 is discharged from the water conditioning units 22 into a supply side manifold assembly 24. The supply side manifold assembly 24 distributes the cooling medium 16 to a number of cold plates 26 (FIG. 1) which are juxtaposed to the various nodes 14 of the electronic component or computer 12 to thereby cool the associated component via heat transfer to the cooling medium. Any number of nodes may be present in the electronic component 12. The heated cooling medium 16 is extracted from the cold plates 26 through a return side manifold assembly 25 and processed through a heat exchanger 28, after which the cooling medium 16 is discharged through the water conditioning units 22 to the return line 20 of the cooling system 10. As will be appreciated, the exemplary electronic component cooling system 10 shown in FIG. 5 is for illustration only and other designs of cooling systems, for electronic components or computers may be utilized within the scope of this invention.

Figure 1:
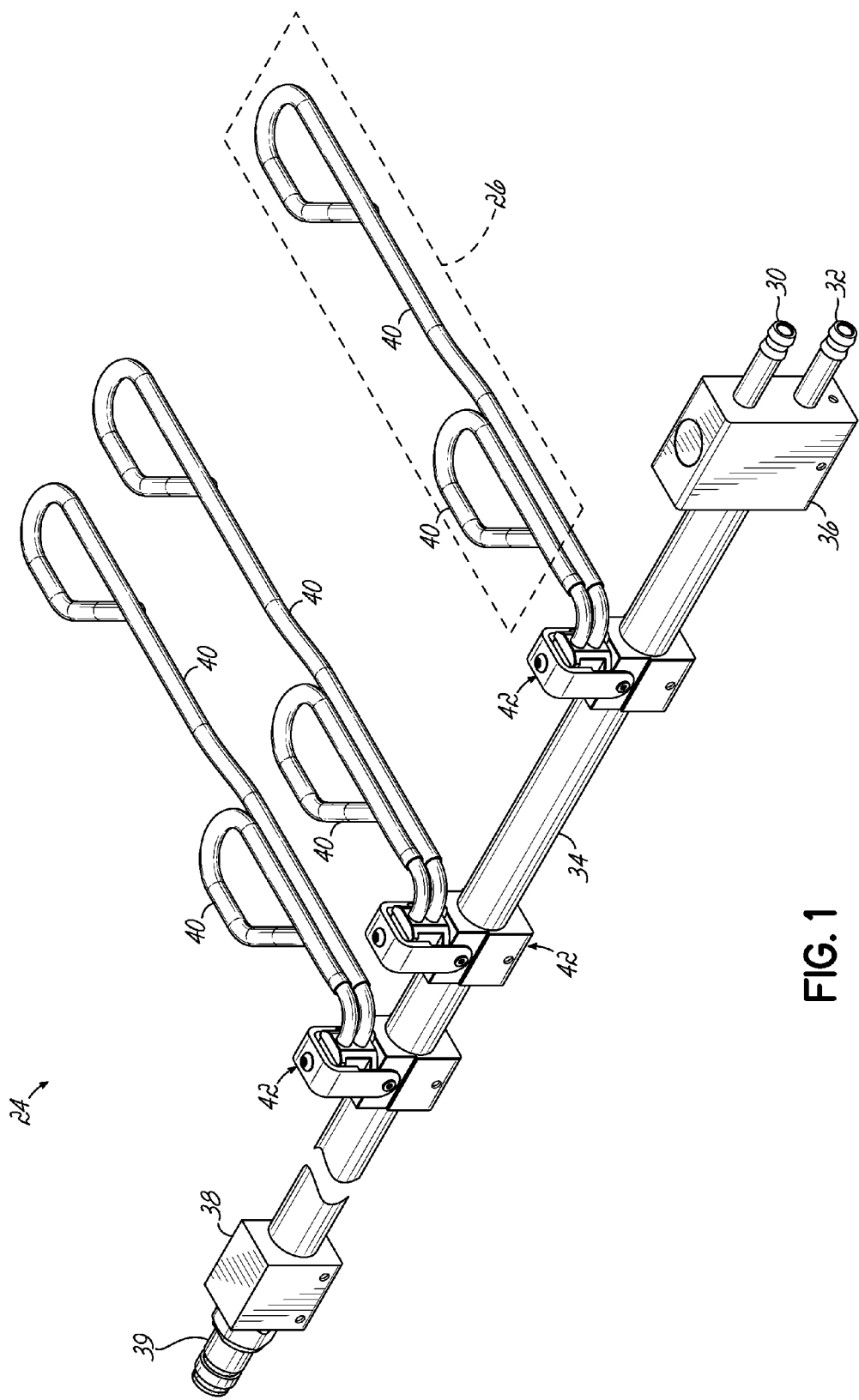
FIG. 1 is a perspective view of a cooling system for a number of electronic components according to one embodiment of this invention.
Figure 2:
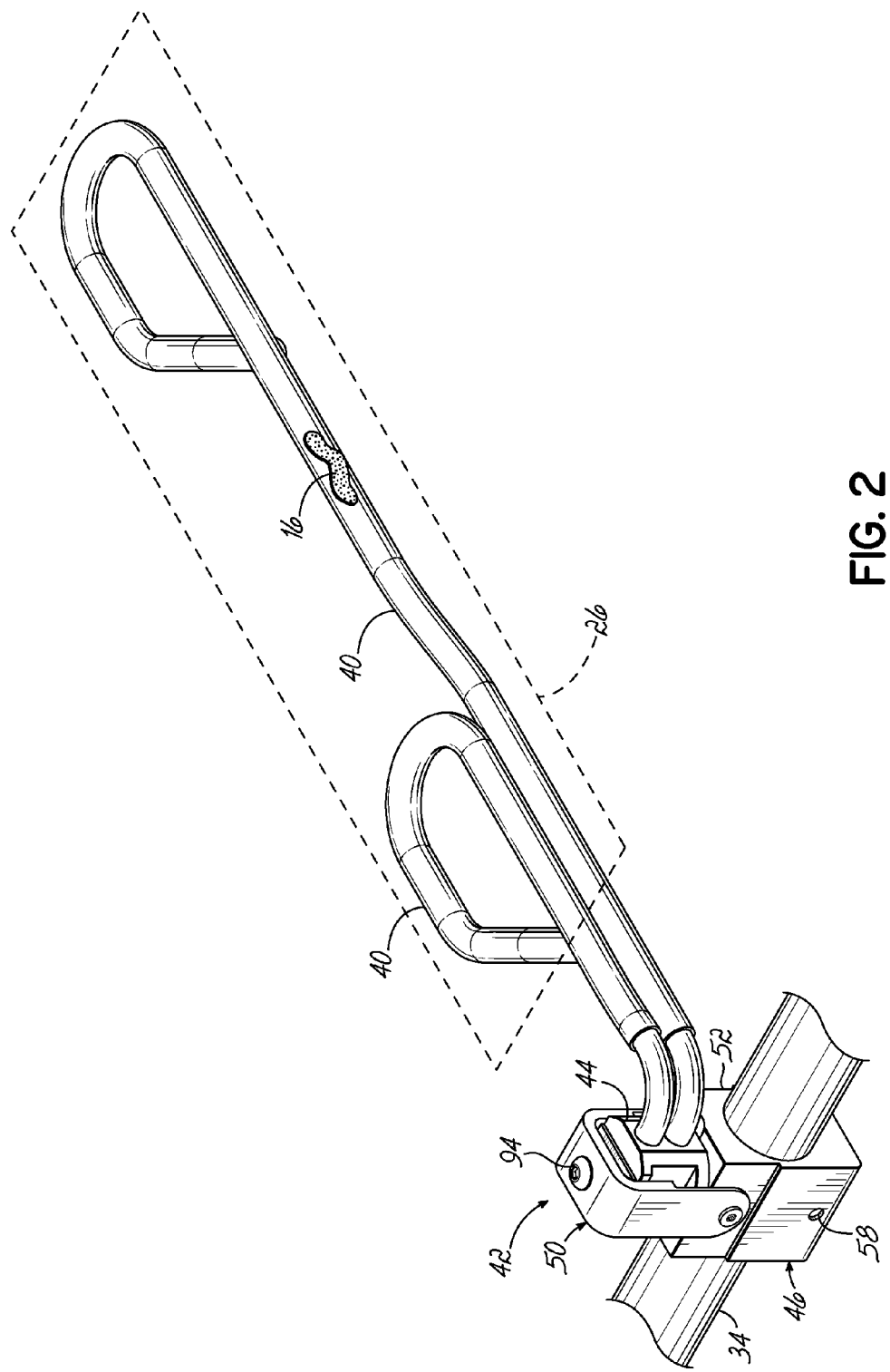
FIG. 2 is an enlarged view similar to FIG. 1 showing a fitting assembly coupled to a manifold of the cooling system.

Referring to FIGS. 1 and 2, one embodiment of the cold plate 26 for the node 14 of the electronic component 12 coupled to the cooling system 10 according to this invention is shown. The supply side manifold assembly 24 is shown in FIG. 1 for simplicity; however, the return side manifold assembly 25 likewise includes the same components and elements as those shown in FIG. 1 with comparable functions in a return mode as opposed to a supply mode for the cooling fluid medium 16. The supply side manifold assembly 24 includes dual front end manifold lines 30, 32 for the cooling medium 16, each of which project from a downstream junction block 36. An upstream junction block 38 has an assembly manifold disconnect fitting 39 through which the fluid cooling medium 16 enters the supply side manifold assembly 24. A manifold tube 34 extends between the upstream and downstream junction blocks 38, 36 of the manifold assembly 24. Each cold plate 26 shown schematically in FIGS. 1 and 2 includes first and second cooling tubes 40 each coupled to a fitting assembly 42 mounted on the manifold tube 34. In one embodiment, the cooling tubes 40 are brazed to a fitting 44 sitting atop the fitting assembly 42 so that the cooling medium 16 may pass from the manifold tube 34 through the fitting assembly 42 and into the cooling tubes 40 of the associated cold plate 26 and to thereby cool the processor node associated with the cold plate 26. The fitting 44 of each fitting assembly 42 is mounted atop a manifold 46. The fitting assembly 42 includes a longitudinal passage 48 there through for the manifold tube 34. According to one embedment of this invention, the fitting 44 is securely retained atop the manifold 46 by a latch 50 pivotally coupled to the manifold 46 which captures the fitting 44 securely on the manifold 46. As previously noted, the fitting assembly 42 of this invention is readily employed in the supply side manifold assembly 24 as shown in FIGS. 1-2 as well as the return side manifold assembly 25 (FIG. 5).

Figure 3A:
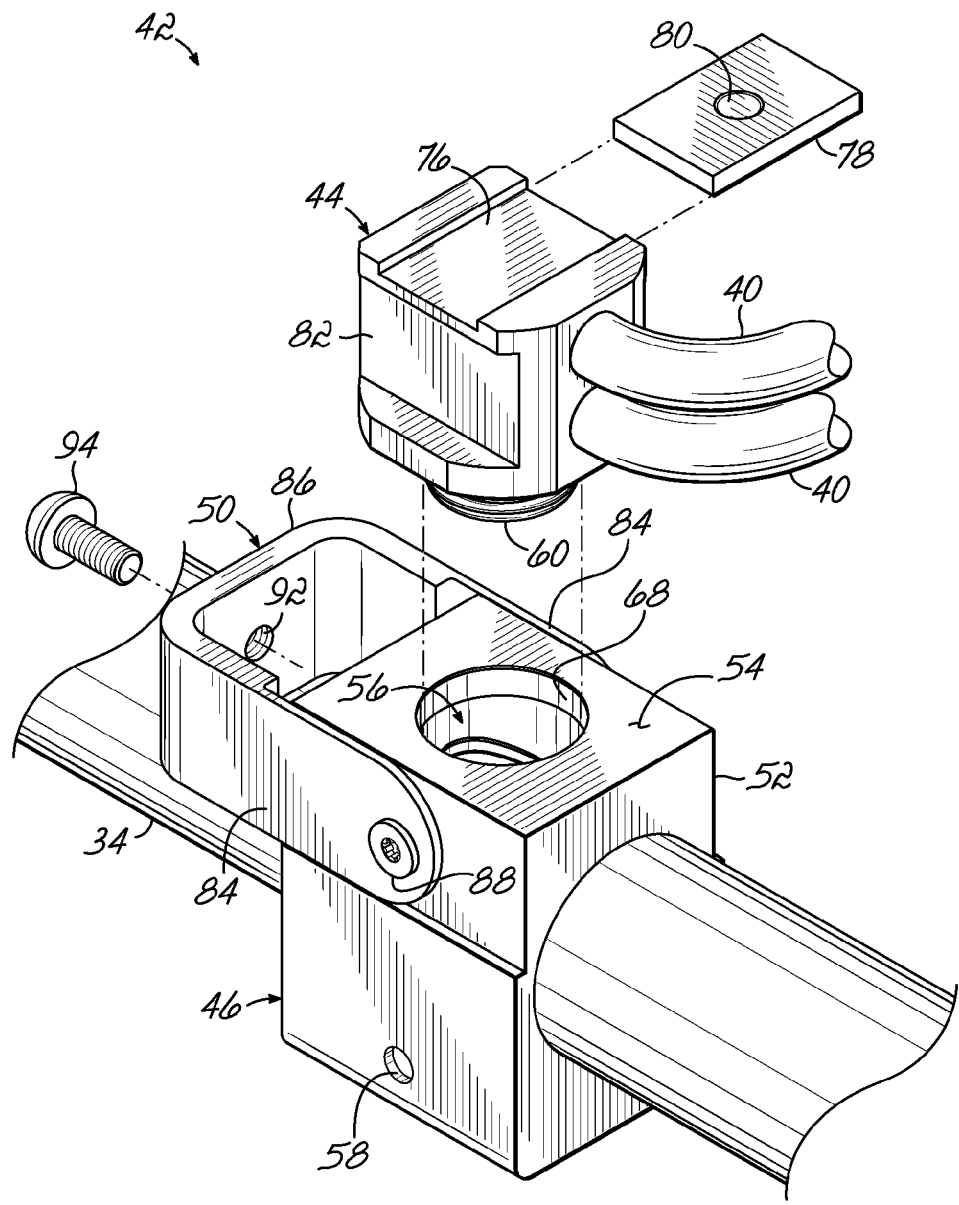
FIG. 3A is an enlarged view of the fitting assembly of FIGS. 1-2 partially disassembled.
Figure 3B:
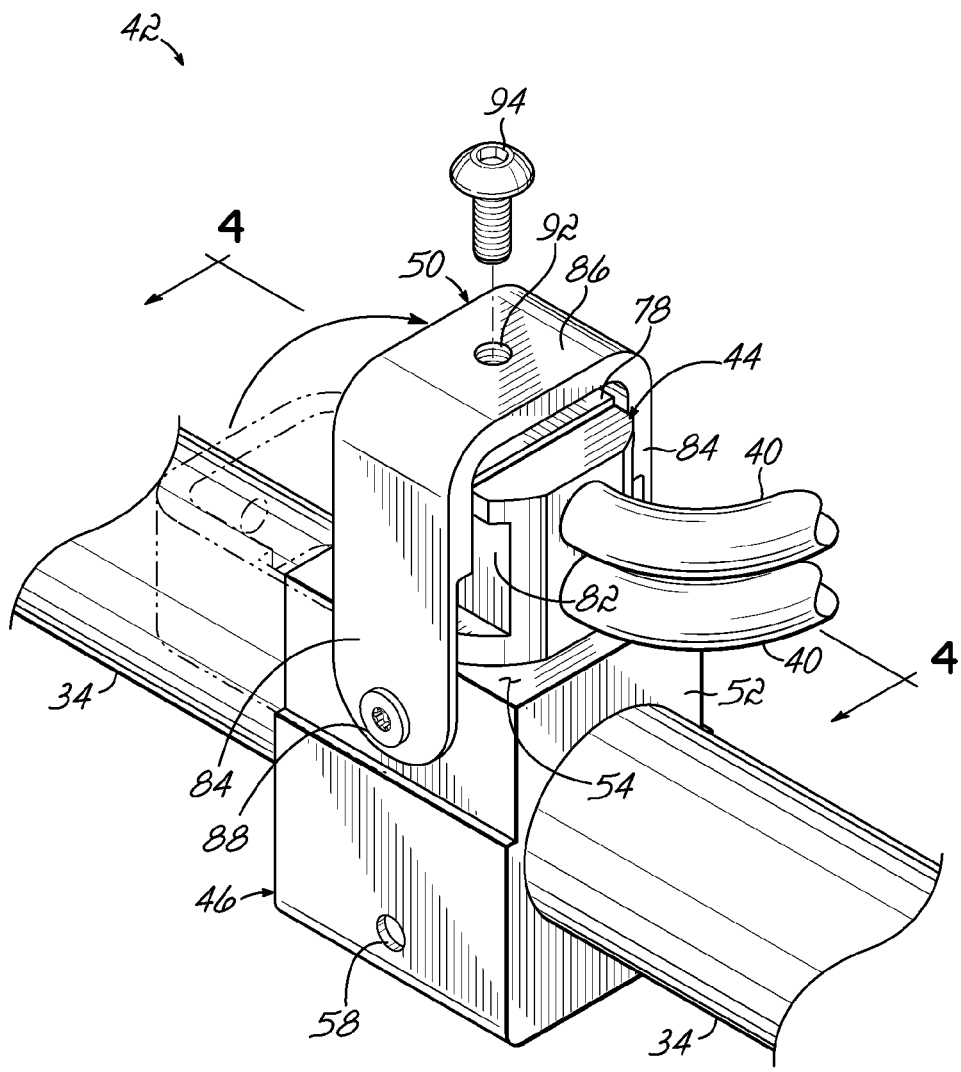
FIG. 3B is a view similar to FIG. 3A with the fitting assembly in a substantially assembled configuration.
Figure 4:
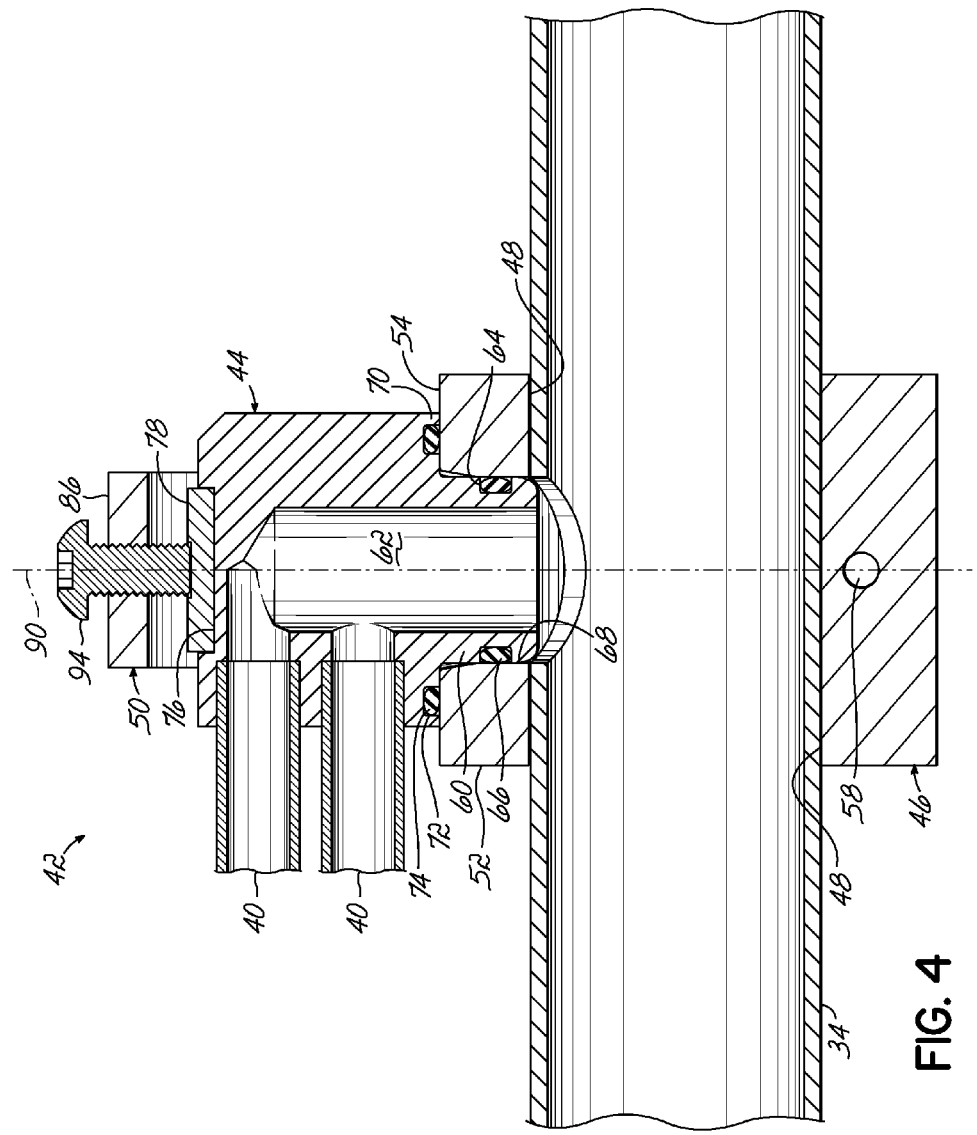
FIG. 4 is a cross-sectional view taken along line 4-4 of FIG. 3B of the fitting assembly.

Referring to FIGS. 3A-4, one embodiment of the fitting assembly 42 according to this invention is shown in various configurations. Each fitting assembly generally includes the manifold 46, the fitting 44, and the latch 50 in one embodiment. The manifold 46 includes an upper manifold mount 52 having an upper face 54 with a port 56 oriented generally vertically in the manifold 46. A chassis mount aperture 58 is provided in the lower portion of the manifold 46 for securing the fitting assembly 42 in the electronic component cooling system 10 as appropriate for the supply or return of the cooling fluid medium 16. The port 56 is in communication with the cooling medium 16 in the manifold tube 34. The port 56 is sized and configured to receive a downwardly extending projection 60 on the fitting 44 as shown particularly in FIG. 4. A main cooling fluid passage 62 extends through the projection 60 and the fitting 44 and is in communication with the cooling tubes 40, two of which are shown in an upper and lower configuration in the embodiment presented in the drawings. The projection 60 includes an outer annular groove 64 into which is seated a first O-ring 66 which seals the projection 60 against a throat 68 of the manifold 46 as shown in FIG. 4. Additionally, a lower flange 70 surrounding the projection 60 on the fitting 44 includes an annular groove 72 in which is seated a second O-ring 74 to seal the fitting against the upper face 54 of the manifold mount 52.

The fitting 44 includes an upper groove 76 sized and configured to receive a bearing plate seated 78 in the groove 76. The bearing plate 78 has a central seat 80 on its upper face. The bearing plate 78 may be easily installed and adhesively retained in the groove 76 in the fitting 44 as needed. The bearing plate 78 may be selectively removed from the fitting 44 as needed for replacement, repair, repositioning or the like. Pair of undercut channels 82 are each on one opposite faces of the fitting 44. These channels 82 are available for convenient and secure installation and removal of the fitting onto the manifold 46 without damaging the various components of the system. For example, a tool, such as the jaws of pliers or other device, may be seated within the spaced channels 82 for securely gripping and manipulating the fitting 44 for installation and removal relative to the manifold 46.

The latch 50 is pivotally coupled to the manifold mount 52 as shown generally in FIGS. 3A-3B. In one embodiment, the latch 50 has a generally inverted U-shape with a pair of legs each extending from a central portion 86 of the latch 50. A distal end portion of each leg 84 is pivotally coupled to one of two opposite faces of the manifold mount 52. A pivotal connector, such as a rivet 88 or other device, pivotally secures the leg to the manifold mount. As such, the latch 50 may be pivoted to and between a first position in which the latch 50 captures and overlies the fitting 44 when it is mounted to the manifold mount 52 as shown in FIG. 3B. In this orientation, the latch 50 extends generally vertically and is aligned with the longitudinal axis 90 of the fitting 44 and the manifold 46. The latch 50 may be likewise pivoted to a second position as shown in FIG. 3A in which the upper face 54 of the manifold mount 52 is exposed and the latch 50 is in generally a horizontal orientation to provide access to the manifold mount 52 and port 56 for installation and removal of the fitting 44. Naturally, the orientation of the latch 50 in the configuration shown in FIG. 3A is opposite from the face of the fitting 44 on which the cooling tubes 40 are joined to the fitting 44 so as to provide access and operation for these components as described.

The central portion 86 of the latch 50 includes a threaded hole 92 sized and configured to receive therein a load screw 94. With the fitting 44 initially seated on the manifold 46 and the projection 60 of the fitting 44 extending into the port 56, the latch 50 is pivoted into the position shown in FIG. 3B with the load screw 94 retracted in the hole 92. The load screw 94 is threadably advanced through the hole 92 and a terminal end of the load screw 92 contacts the seat 80 on the bearing plate 78. Continued rotation and advancement of the load screw 94 toward the bearing plate 78 forces the bearing plate 78 and fitting 44 downwardly into a secure and mating relationship with the manifold 46. The bearing plate 78 distributes the forces delivered by the load screw 94 evenly across the fitting 44 so as to avoid any damage to the fitting 44 which, in one embodiment, is constructed of copper. Moreover, the load screw 94, bearing plate 78, fitting projection 60 and port 56 are generally aligned along the longitudinal axis 90 of the fitting assembly 42 as shown generally in FIG. 4 such that the force delivered by the latch 50 and load screw 94 is axially aligned with the projection 60 of the fitting 44 and the port 56 to provide a secure, stable and reliable connection between the fitting 44 and the manifold 46 for fluid communication of the cooling medium 16 through the assembly.

Moreover, the cooling medium 16 flowing through the fitting 44 is inhibited from leaking as a result of the dual O-rings 66, 74 on different surfaces between the mating fitting 44 and manifold 46. In one embodiment, the O-rings 66, 74 are positioned on respective sealing surfaces that are not co-planar and, in one embodiment, are orthogonal or perpendicular to one another to form sealing interfaces between the fitting and the manifold mount for enhanced sealing effectiveness. The copper fitting 44 in one embodiment of the cooling system 10 is brazed to the terminal ends of the cooling tubes 40 for reliability during operation of the cooling system 10. The load delivered by the latch 50 creates a seal along the longitudinal axis 90 as shown in FIG. 4 in a top-down actuation position as shown in FIG. 3B. The load screw 94 and latch 50 deliver the load directly along the longitudinal axis 90 and eliminate the need for multiple fasteners as in prior art fitting assemblies. Moreover, the fitting 44 and latch 50 of various embodiments of this invention eliminate the need for tool or wrench clearance in a horizontal, vertical or other orientation to actuate a large nut or other mechanical device and effectuate a sealing engagement between the fitting 44 and manifold 46. Commonly, two wrenches are required to secure a known fitting assembly to the manifold in a cooling system for an electronic component, one wrench to tighten the fitting and one to keep the assembly from twisting during the tightening motion. The limited space constraints and accessibility of the electronic component and associated cooling system components limit the utility of such prior fitting assemblies for a cooling system. The latch 50 and fitting assembly 42 of various embodiments of this invention offer the direct top-down axial fitting actuation without the need for tool access other than in the axial direction for a screwdriver, Allen wrench or the like for the load screw 94. Tool access off of the longitudinal axis 90 (FIG. 4) is not required, thereby allowing for tighter and more compact arrangement of the components of the electronic component cooling system 10 according to this invention. The fitting 44 may be manually pushed into the port 56 on the manifold mount 52 and once the O-rings 66, 74 seal to the manifold mount 52, the latch 50 is pivoted into the position shown in FIG. 3B. The load screw 94 is retracted to provide for clearance when the latch 50 is pivoted from the position shown in FIGS. 3A to the position shown in FIG. 3B. Once in position as in FIG. 3B, the load screw 94 evenly engage the bearing plate 78 which in one embodiment is stainless steel, on the top of the fitting 44. The bearing plate 78 prevents debris and excess wear on the copper fitting 44 by the actuation of the load screw 94. The relatively small contact area of the load screw 94 against the bearing plate 78 along the longitudinal axis 90 of the fitting 44 decouples the screw torque from the remainder of the assembly. This protects the cooling tubes 40 from being damaged and from putting tension on the fitting 44 that could impact proper alignment and positioning of the cooling tubes 40. The load screw 94 is driven downwardly to a fixed torque that is sufficient to bring the base of the fitting 44 in direct contact with the upper face 54 of the manifold mount 52. Advantageously, the fitting 44 of this invention provides redundancy because the various mating surfaces and 0-rings 66, 74 between the manifold mount 52 and the fitting 44 are in different planes and proper positioning of the various components can be visually inspected and determined when the fitting 44 is appropriately seated on the manifold mount 52.

Nonetheless, those of ordinary skill in the art may appreciate that based on the principles of this invention that modifications and changes may be made to the embodiments of the invention shown and described herein without departing from the scope of this invention. Therefore, the invention lies in the claims hereinafter appended.

What is claimed is:
1. A computer comprising:
a plurality of processors;
a cooling system in communication with the processors to cool the processors, the cooling system further comprising,
(a) a plurality of cold plates;
(b) a plurality of cooling tubes each routed through one of the cold plates to carry liquid cooling medium therethrough;
(c) a manifold assembly having a manifold tube in communication with each of the cooling tubes to transmit liquid cooling medium relative to each of the cold plates;

(d) a plurality of fitting assemblies each connecting the cooling tubes associated with one of the cold plates to the manifold assembly, each fitting assembly further comprising,
  (1) a manifold mount having the manifold tube passing therethrough;
  (2) a port in fluid communication with the manifold tube;
  (3) a fitting sized to mate with the port, the fitting being coupled in fluid communication with the associated cooling tubes; and
  (4) a latch pivotally mounted to the manifold mount for movement to and between a first position in which the latch secures the fitting in direct contact with the manifold mount with the fitting captured between the latch and the manifold mount and a second position in which the latch provides access to the manifold mount and port for installation and removal of the fitting.

2. The computer of claim 1 wherein the latch is generally U-shaped with a pair of legs each extending from a central portion of the latch, the legs being pivotally coupled to opposite sides of the manifold mount, wherein the central portion of the latch captures the fitting onto the manifold mount when the latch is in the first position.

3. The computer of claim 1 further comprising:
a load screw threadably inserted through the latch to engage the fitting when the latch is in the first position to thereby secure the fitting to the manifold mount.

4. The computer of claim 3 further comprising:
a bearing plate mounted on the fitting positioned to be engaged by the load screw when the latch is in the first position and thereby alleviate stress and damage to the fitting.

5. The computer of claim 4 wherein a longitudinal axis of the load screw is aligned with a longitudinal axis of the port when the latch is in the first position.

6. The computer of claim 1 further comprising:
a first and a second sealing interface between the fitting and the manifold mount wherein the first and second sealing interfaces are in different planes from one another.

7. The computer of claim 6 wherein the different planes are generally perpendicular to each other.

8. A cooling system for an electronic component comprising:
at least one cold plate;
at least one cooling tube routed through the cold plate to carry liquid cooling medium therethrough;
a manifold assembly having a manifold tube in communication with each cooling tube to transmit liquid cooling medium relative to each cold plate;
at least one fitting assembly connecting the cooling tube associated with each cold plate to the manifold assembly, each fitting assembly further comprising,
  (a) a manifold mount having the manifold tube passing therethrough;
  (b) a port in fluid communication with the manifold tube;
  (c) a fitting sized to mate with the port, the fitting being coupled in fluid communication with the associated cooling tube; and
  (d) a latch pivotally mounted in direct contact with the manifold mount with the fitting captured between the latch and the manifold mount for movement to and between a first position in which the latch secures the fitting to the manifold mount and a second position in which the latch provides access to the manifold mount and port for installation and removal of the fitting.

9. The cooling system of claim 8 wherein the latch is generally U-shaped with a pair of legs each extending from a central portion of the latch, the legs being pivotally coupled to opposite sides of the manifold mount.

10. The cooling system of claim 9 wherein the central portion of the latch captures the fitting onto the manifold mount when the latch is in the first position.

11. The cooling system of claim 8 further comprising:
a load screw threadably inserted through the latch to engage the fitting when the latch is in the first position to thereby secure the fitting to the manifold mount.

12. The cooling system of claim 11 further comprising:
a bearing plate on the fitting positioned to be engaged by the load screw when the latch is in the first position and thereby alleviate stress and damage to the fitting.

13. The cooling system of claim 12 wherein a longitudinal axis of the load screw is aligned with a longitudinal axis of the port when the latch is in the first position.

14. The cooling system of claim 8 further comprising:
a first and a second sealing interface between the fitting and the manifold mount wherein the first and second sealing interfaces are in different planes from one another.

15. The cooling system of claim 13 wherein the different planes are generally perpendicular to each other.

16. The cooling system of claim 8 further comprising:
a pair of spaced channels, each of which is each located on an opposite side of the fitting to assist in installation and removal of the fitting relative to the manifold mount.

17. A fitting assembly to connect cooling tubes in a cold plate for cooling an electronic component to a manifold system transmitting a cooling fluid to and from the cold plate, the fitting assembly comprising:
a manifold mount;
a port in the manifold mount in fluid communication with the manifold system;
a fitting sized to mate with the port, the fitting being coupled in fluid communication with a cooling tube; and
a latch pivotally mounted in direct contact with the manifold mount with the fitting captured between the latch and the manifold mount for movement to and between a first position in which the latch secures the fitting to the manifold mount and a second position in which the latch provides access to the manifold mount and port for installation and removal of the fitting.

18. The fitting assembly of claim 17 wherein the latch is generally U-shaped with a pair of legs each extending from a central portion of the latch, the legs being pivotally coupled to opposite sides of the manifold mount, wherein the central portion of the latch captures the fitting onto the manifold mount when the latch is in the first position.

19. The fitting assembly of claim 17 further comprising:
a load screw threadably inserted through the latch to engage the fitting when the latch is in the first position to thereby secure the fitting to the manifold mount.

20. The fitting assembly of claim 19 further comprising:
a bearing plate on the fitting positioned to be engaged by the load screw when the latch is in the first position and thereby alleviate stress and damage to the fitting.

21. The fitting assembly of claim 19 wherein a longitudinal axis of the load screw is aligned with a longitudinal axis of the port when the latch is in the first position.

22. The fitting assembly of claim 17 further comprising:
a pair of spaced channels, each of which is on an opposite side of the fitting to assist in installation and removal of the fitting relative to the manifold mount.

23. The fitting assembly of claim 17 further comprising:
a first and a second sealing interface between the fitting and the manifold mount wherein the first and second sealing interfaces are in different planes from one another.

24. The fitting assembly of claim 23 wherein the different planes are generally perpendicular to each other.

\* \* \* \* \*